(12) United States Patent
Weisman

(10) Patent No.: US 7,883,289 B2
(45) Date of Patent: Feb. 8, 2011

(54) RETAINER FOR PRINTED CIRCUIT BOARDS

(75) Inventor: Arnold Weisman, Glendora, CA (US)

(73) Assignee: Pentair Electronic Packaging Company, Poway, CA (US)

( * ) Notice: Subject to any disclaimer, the term of this patent is extended or adjusted under 35 U.S.C. 154(b) by 0 days.

(21) Appl. No.: 12/178,533

(22) Filed: Jul. 23, 2008

(65) Prior Publication Data

US 2010/0022117 A1    Jan. 28, 2010

(51) Int. Cl.
  *F16B 2/14* (2006.01)
(52) U.S. Cl. .................................. 403/374.4; 403/409.1
(58) Field of Classification Search ................. 403/364, 403/374.2–374.4, 409.1; 81/58.3, 467
  See application file for complete search history.

(56) References Cited

U.S. PATENT DOCUMENTS

| | | | | |
|---|---|---|---|---|
| 2,965,383 A * | 12/1960 | Steiner et al. | ............... | 279/102 |
| 4,775,260 A * | 10/1988 | Kecmer | ................... | 403/409.1 |
| 4,817,475 A * | 4/1989 | Kelly et al. | ................. | 81/121.1 |
| 5,607,273 A * | 3/1997 | Kecmer et al. | ................. | 411/79 |
| 5,779,388 A * | 7/1998 | Yamamoto | ............... | 403/374.1 |
| 6,249,936 B1 * | 6/2001 | Webster | ........................ | 24/569 |
| 6,285,564 B1 * | 9/2001 | O'Brien | ........................ | 361/801 |
| 6,615,997 B2 * | 9/2003 | Danello et al. | ................. | 211/26 |
| 6,851,334 B2 * | 2/2005 | Hsien | ........................ | 81/63.1 |
| 6,915,723 B2 * | 7/2005 | Hsieh | ............................ | 81/60 |
| 7,156,002 B1 * | 1/2007 | Chan | ......................... | 81/177.4 |
| 2006/0083584 A1 * | 4/2006 | Abrahamian | ................ | 403/364 |

* cited by examiner

*Primary Examiner*—Joshua T Kennedy
(74) *Attorney, Agent, or Firm*—Inskeep IP Group, Inc.

(57) ABSTRACT

A printed circuit board retaining device for use in securing a printed circuit board in an elongated slot of a rack provides an efficient design allowing for the utilization of an off-the-shelf screw in the device. A screw having a head located within a first end piece interconnects the first end piece, at least one elongated wedge, and a second end piece. A clutch assembly, also retained within the first end piece, is coupled to the screw by a tool configured to engage the screw head. The clutch assembly has a first and second clutch head. The second clutch head being attached to the opposite side of the tool configured to engage the screw head.

8 Claims, 3 Drawing Sheets

RETAINER FOR PRINTED CIRCUIT BOARDS

FIELD OF THE INVENTION

This invention relates to devices for retaining and fastening printed circuit boards within a rack or chassis.

BACKGROUND OF THE INVENTION

Elongated wedge-type devices for retaining printed circuit boards ("PCBs") within elongated slots in racks or chassis are in common use. The devices typically include a center wedge having sloped surfaces at opposite ends and two end pieces having sloped surfaces that abut against the sloped surfaces of the center wedge. The retaining devices are typically constructed with three or five wedges. A screw or shaft extends lengthwise through and connects the end wedges and the center wedge. In operation, a PCB is typically fastened to the backside of the center wedge. The PCB, with the retaining device attached thereto, is placed within the desired slot of the rack. Rotating the screw or shaft in one direction draws the two end wedges toward each other, causing them to deflect transversely on the sloped abutting surfaces of the center wedge. This results in increasing the device's effective width and wedging the PCB into the desired location. Rotating the screw in the opposite direction moves the two end wedges apart from each other bringing them back into longitudinal alignment with the center wedge and, thereby, releasing the PCB. Examples of such devices are described in greater detail in U.S. Pat. Nos. 4,775,260, 5,607,273, and 5,779,388, which are hereby incorporated by reference.

PCB retaining devices are preferably designed to limit the amount of force applied to the PCB while held in a slot. One solution to this problem has been to integrate clutch assemblies into the retaining device. The clutch is typically configured to have a first and second clutch head having cooperating teeth. By manipulating the angle of the clutch head teeth and the force in which the clutch heads are urged together, the torque applied to the screw and, in turn, the wedging force generated by the retaining device may be controlled. Unfortunately, the integration of the clutch assembly into the retaining device has typically led to the use of custom components in the retaining device. Utilization of custom components results in increased design and manufacturing costs and limits the number of suppliers from which the components can be sourced. It would be desirable to develop a PCB retaining device that maximizes the use of off-the-shelf parts without sacrificing utility. If custom components are used, it would be desirable to limit them to small, relatively affordable components.

OBJECTS AND SUMMARY OF THE INVENTION

In view of the foregoing, one aspect of the present invention is to provide a PCB retaining device that overcomes the shortcomings of the prior art. More particularly the present invention is to provide a PCB retaining device that incorporates a clutch design configured to allow for the use of a standard, off-the-shelf type screw in the retaining device.

BRIEF DESCRIPTION OF THE DRAWINGS

These and other aspects, features and advantages of which embodiments of the invention are capable of will be apparent and elucidated from the following description of embodiments of the present invention, reference being made to the accompanying drawings, in which.

DESCRIPTION OF EMBODIMENTS

Figure 1:
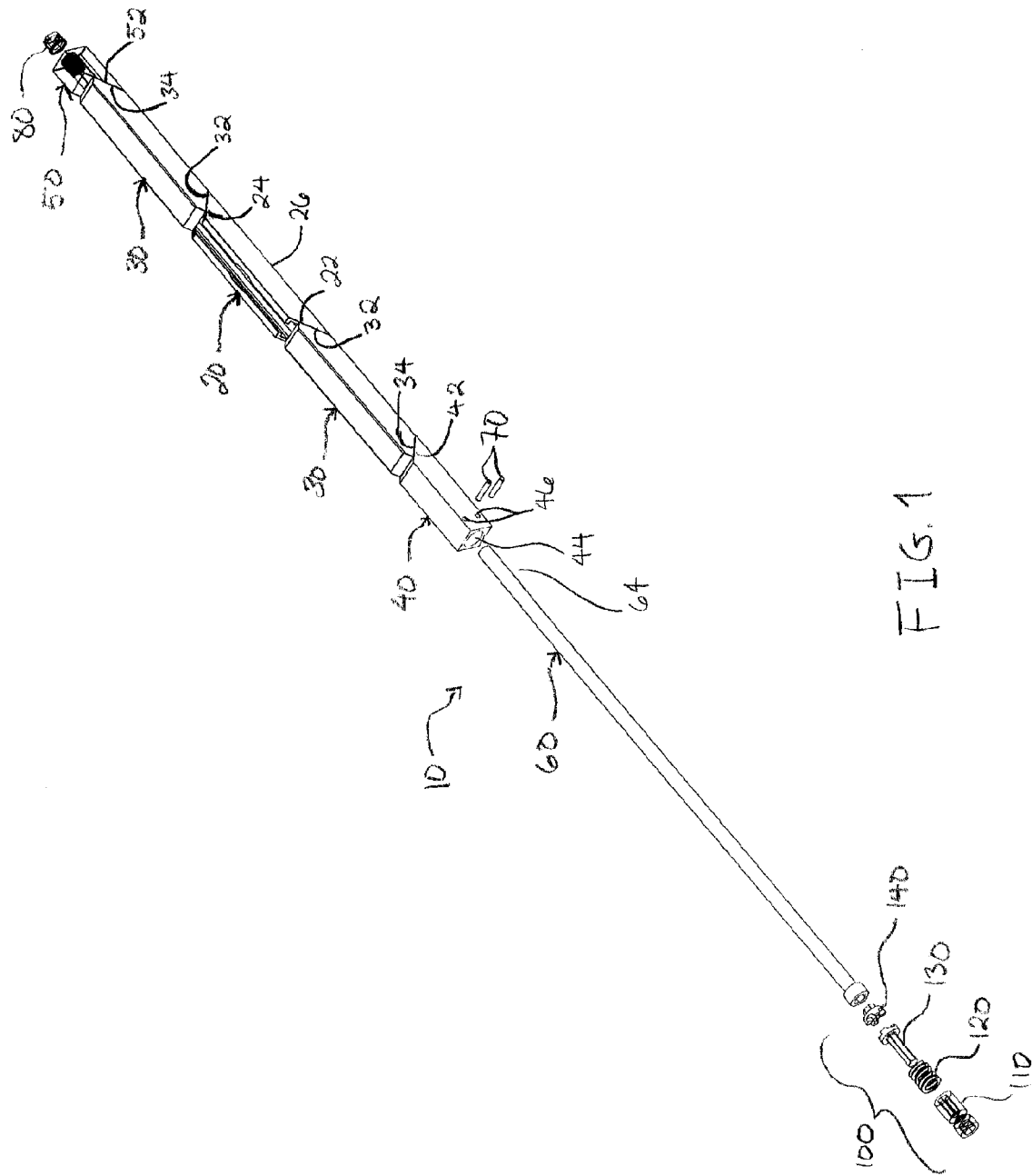
FIG. 1 is a perspective view of a PCB retaining device according to the present invention.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
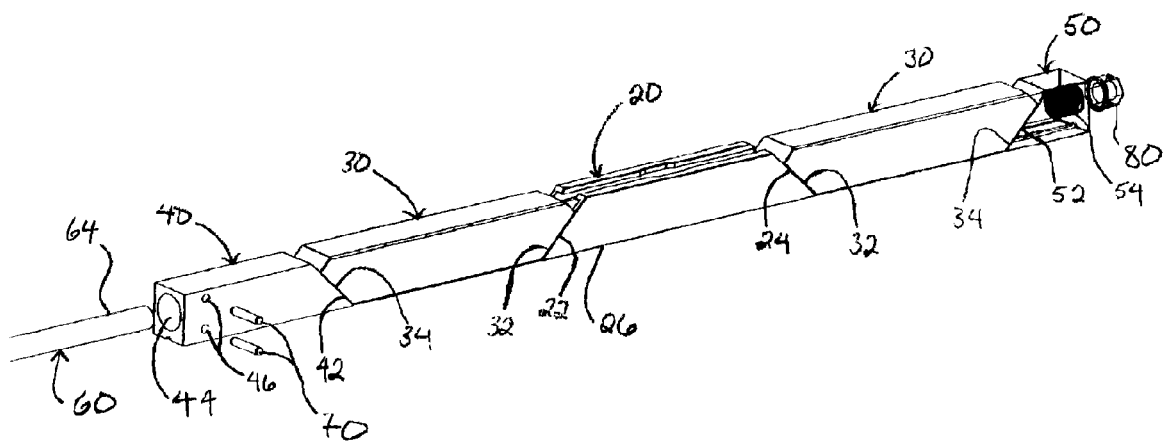
FIG. 2 is a perspective view of a wedge assembly and screw of a PCB retaining device according to the present invention; and, FIG. 3 is perspective view of a clutch assembly and screw of a PCB retaining device according to the present invention.
Figure 3:
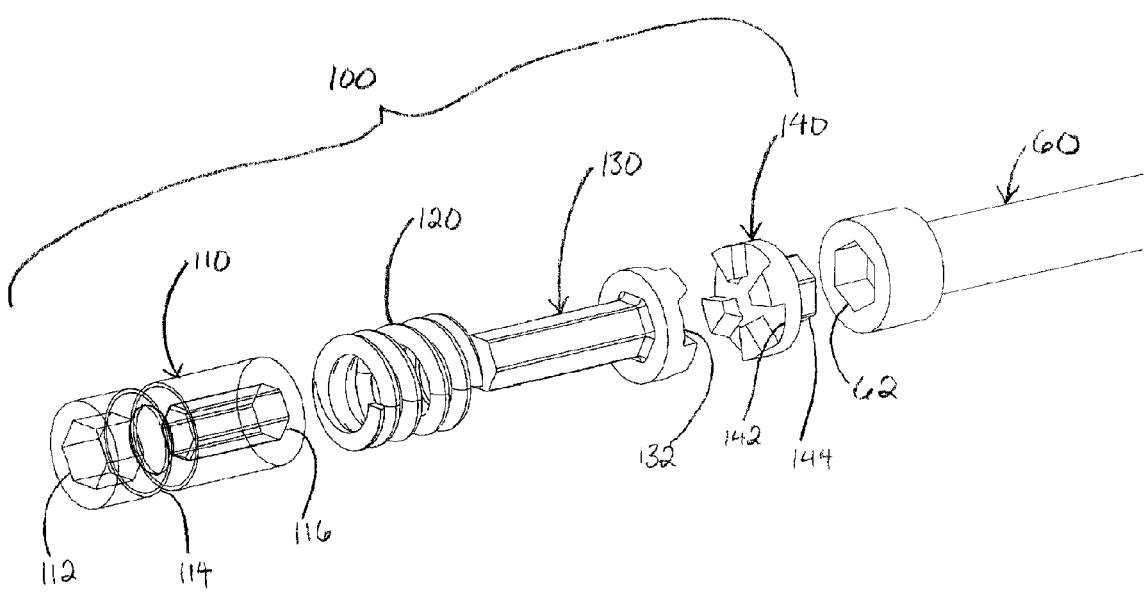

In accordance with the present invention, a PCB retaining device 10 is depicted in FIGS. 1 through 3. The retaining device 10 may be attached to a PCB (not shown) at a backside 26 of the center wedge 20 by screws or rivets. The center wedge 20 includes the sloped surfaces 22 and 24 at its opposite ends. The retaining device 10 may further include the wedges 30 having sloped surfaces 32 and 34 on opposite sides. The sloped surfaces 32 of the wedges 30 abut the sloped surface 22 and 24 of the center wedge 20. The first and second end pieces 40 and 50 include the sloped surfaces 42 and 52, respectively that abut against the sloped surfaces 34 of the wedges 30. A screw 60 engages a clutch assembly 100 positioned within a recess 44 formed in the first end piece 40. The screw 60 passes through a first wedge 40, the center wedge 20, and a second wedge 30. A threaded bore 54 of the second end piece 50 receives a distal end 64 of the screw 60.

In a manner analogous to that described with respect to the prior art, drawing the two end pieces 40 and 50 toward each other by rotating the screw 60 causes the two wedges 30 to move together transversely relative to the center wedge 20. An elongated channel through the center wedge 20 and the wedges 30 (not shown) is sized and shaped to accept the screw 60 and permit this relative transverse movement of the screw 60. This transverse movement effectively increases the width of the retaining device 10, and thereby locks the attached PCB into a slot. It would be appreciated by one skilled in the art that a PCB retaining device according to the present invention may incorporate any odd number of wedging components. For example, a retaining device in accordance with the present invention may alternatively comprise only the center wedge 20 and the two end pieces 40 and 50.

The retaining device 10 also includes a clutch assembly 100 for limiting the maximum forward torque that can be applied to the screw 60. This, in turn, controls the clamping force of the retaining device 10, and thus prevents possible physical or functional damage to the PCB being retained. With particular reference to FIG. 3, the clutch assembly 100 includes (1) a drive head 110 having a proximal recess 112, a groove 114, and a distal recess 116; (2) a spring 120; (3) a shaft 130 having a first clutch head 132; and (4) a clutch interface 140, having a second clutch head 142 and a tool 144.

The proximal recess 112 of drive head 110 is configured to receive a conventional driver tool such as, but not limited to, a Phillips tip driver, square tip driver, triple square tip driver, torx tip driver, nut driver, or hexagonal driver. The groove 114 of the drive head 110 is sized and shaped to engage the pins 70 inserted through the holes 46 of the first end piece 40. Engagement of the pins 70 by the groove 114 serve to axially, but not rotationally, secure the drive head 110 within the first end piece 40. The distal recess 116 of drive head 110 serves to receive the shaft 130 which passes through the spring 120. The shaft 130 and the distal recess 116 are sized and shaped to be complementary to one another, e.g. the shaft 130 is illustrated as a hexagonal shaft and the female recess 116 as a hexagonal recess operable for receiving and engaging the shaft 130. It will be recognized that the shaft 130 and the distal recess 116 may be sized and shaped in any number of cross sectional shapes operable to facilitate engagement between the two components. Because the drive head 110 is secured in a fixed location within the first wedge 40 by the pins 70, the spring 120 acts against the drive head 110 and serves to push the shaft 130 away from the drive head 110, thereby urging the first clutch head 132 of the shaft 130 towards the second clutch head 142 of clutch interface 140.

Of particular significance is the configuration of the clutch interface 140. The clutch interface 140 serves, in part, to couple the clutch assembly 100 to the screw 60. As illustrated in FIG. 3, the clutch interface 140 comprises the second clutch head 142 on one side and the male tool 144 on the other side. As described with respect to the prior art, the first clutch head 132 and the second clutch head 142 each have a series or pattern of teeth that are complementary to and operable to engage with one another. The tool 144 is sized and shaped to emulate the working portion of a conventional driver tool such as, but not limited to, a Phillips tip driver, square tip driver, triple square tip driver, torx tip driver, nut driver, or hexagonal driver and to thereby engage the screw head recess 62 of the screw 60. It will be appreciated that the above described configuration of the interface 140 allows for the incorporation of a standard, off-the-shelf type screw that may be purchased from numerous suppliers of fasteners and screws. Alternatively stated, it is preferable that screw 60 not be a custom or specially designed and manufactured screw. For example, screw 60 may be a standard sized and shaped screw with a female hexagonal head. The ability to utilize an off-the-shelf screw 60 aids in reducing manufacturing costs and facilitates component sourcing for the retaining device 10.

In use, a conventional driver tool such as a hex key is used to engage the proximal recess 112 of the driver head 110, to rotate the driver head 110 and the first clutch head 132 of the shaft 130. Because the spring 120 biases the first clutch head 132 against the second clutch head 142, the rotation is coupled to the second clutch head 142 and, ultimately to the screw 60.

The confronting faces of the first clutch head 132 and second clutch head 142 both include a series of ratchet teeth or other form of engageable series of recessions and protrusions. It should be appreciated that the angles selected for the teeth or other form of engageable series of recessions and protrusions may vary according to the torque limits selected, the frictional forces encountered, and the biasing spring force selected.

During a forward rotation of the driver head 110, which tightens the PCB and retaining device 10 against the side walls of a slot, the screw 60 will eventually encounter significant resistance to further rotation. When this occurs, the surfaces of the first clutch head 132 will begin sliding or ramping up on the tooth surfaces of the second clutch head 142, against the yielding resistance of the compression spring 120. Eventually, the first clutch head 132 will be unable to overcome the resisting torque of the second clutch head 142 and slide over or cease to engage the teeth of second clutch 142. At this stage the retaining device 10 will be tightened to a predetermined torque.

As shown in FIGS. 1 and 2, a threaded nut 80 is used to secure the distal end of the screw 60 that transverses threaded bore 54 of second end piece 50. This prevents an inadvertent disassembly of the wedges 30 and 20 and end pieces 40 and 50 by excessively unthreading the screw 60.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A retaining device for a printed circuit board comprising:
   at least one elongated wedge having a first sloped end located opposite a second sloped end;
   a first end piece and a second end piece each located at opposite ends of the at least one elongated wedge;
   a screw having a head located within the first end piece, the head having an engagement feature comprising a central recess therein, or, in the alternative, an external polygonal shape, configured to engage a driving tool, the screw extending through and interconnecting the at least one elongated wedge and the first and second end pieces; and
   a clutch assembly axially retained within the first end piece and comprising:
      a shaft having a first end having a first clutch head comprising a series of teeth and a second end capable of engaging a drive head, and
      a clutch interface having a second clutch head having a series of teeth complementary and configured to engage the series of teeth of the first clutch head and a driving tool matingly engaging the engagement feature of the screw head, such that the clutch interface couples the clutch assembly to the screw.

2. The retaining device of claim 1, wherein the tool is a tool selected from a group of tools consisting of: Phillips tip driver, square tip driver, triple square tip driver, torx tip driver, nut driver, and hexagonal driver.

3. The retaining device of claim 1, wherein the device comprises an odd number of the at least one elongated wedges.

4. The retaining device of claim 1, wherein the at least one elongated wedge comprises three elongated wedges.

5. The retaining device of claim 1, wherein the clutch assembly further comprises a spring urging the first and second clutch pieces together.

6. The retaining device of claim 1, wherein the clutch assembly is actuated by a tool selected from a group of tools consisting of: Phillips tip driver, square tip driver, triple square tip driver, torx tip driver, nut driver, and hexagonal driver.

7. The retaining device of claim 1, wherein the screw head has an engagement feature consisting of: Phillips head recess, square tip recess, triple square tip recess, torx tip recess, hexagonal recess, and polygonal external shape.

8. A method for retaining a printed circuit board in an elongated slot comprising:

interconnecting a first end piece, at least one elongated wedge, and a second end piece with a screw extending therethrough;

locating a head of the screw having an engagement feature comprising a central recess therein, or, in the alternative, an external polygonal shape within the first end piece;

retaining axially a clutch assembly having a shaft and a clutch interface, sad shaft comprising a first end having a first clutch head comprising a series of teeth and a second end having a drive head, said clutch interface having a second clutch head having a series of teeth complementary and configured to engage the series of teeth of the first clutch head and a drive tool within the first end piece;

inserting the clutch assembly into the screw head by matingly engaging the engagement feature of the screw head with the drive tool of the clutch interface and engaging the series of teeth of the first and second clutch heads; and deflecting transversely the at least one elongated wedge relative to a central axis of the screw by actuating the clutch assembly via the shaft.

\* \* \* \* \*